United States Patent
Pörschmann et al.

(10) Patent No.: US 10,476,522 B2
(45) Date of Patent: Nov. 12, 2019

(54) METHOD FOR RECEIVING A BROADCAST SIGNAL AND BROADCAST RECEIVER DEVICE

(71) Applicant: Preh Car Connect GmbH, Dresden (DE)

(72) Inventors: Thomas Pörschmann, Dresden (DE); Franz Menzel, Dresden (DE)

(73) Assignee: PREH CAR CONNECT GMBH, Dresden (DE)

( * ) Notice: Subject to any disclaimer, the term of this patent is extended or adjusted under 35 U.S.C. 154(b) by 0 days.

(21) Appl. No.: 15/841,992

(22) Filed: Dec. 14, 2017

(65) Prior Publication Data
US 2018/0175884 A1 Jun. 21, 2018

(30) Foreign Application Priority Data
Dec. 17, 2016 (DE) .......... 10 2016 015 126

(51) Int. Cl.
| | |
|---|---|
| *H03M 13/09* | (2006.01) |
| *H04H 40/27* | (2008.01) |
| *H04W 28/04* | (2009.01) |
| *H04L 1/00* | (2006.01) |
| *H04H 60/11* | (2008.01) |

(52) U.S. Cl.
CPC .......... *H03M 13/096* (2013.01); *H03M 13/09* (2013.01); *H04H 40/27* (2013.01); *H04H 60/11* (2013.01); *H04L 1/00* (2013.01); *H04W 28/04* (2013.01); *H04H 2201/11* (2013.01); *H04H 2201/13* (2013.01); *H04H 2201/18* (2013.01); *H04H 2201/20* (2013.01); *H04H 2201/40* (2013.01); *H04H 2201/60* (2013.01)

(58) Field of Classification Search
CPC ..................................... H03M 13/11
USPC ........................................ 714/758
See application file for complete search history.

(56) References Cited

U.S. PATENT DOCUMENTS 8,370,729 B2 * 2/2013 Ko .......... H04L 1/0041
714/790

FOREIGN PATENT DOCUMENTS

CN 101529750 A 10/2013

OTHER PUBLICATIONS

First Office Action for Chinese Patent Application No. 2017113520351 dated Mar. 29, 2019, SIPO, China.

* cited by examiner

*Primary Examiner* — Fritz Alphonse
(74) *Attorney, Agent, or Firm* — M&B IP Analysts, LLC

(57) ABSTRACT

The present disclosure relates to a method and system for receiving a broadcast signal. The system includes a broadcast receiver device having two receiving units, two decoding units, a combining unit and a further processing unit. A broadcast signal is received by both receiving units, so that two reception signals are provided. From each reception signal, a raw data stream is extracted and decoded by the decoding units. It is checked if the data stream provided by each decoding unit is complete. If a first data stream is complete, it is processed by the further processing unit. If the first data stream is incomplete and the second data stream is complete, the second data stream is further processed. If both data streams are incomplete, they will be combined to a combined data stream by the combining unit, the combined data stream being further processed, if it is complete.

9 Claims, 3 Drawing Sheets

METHOD FOR RECEIVING A BROADCAST SIGNAL AND BROADCAST RECEIVER DEVICE

Figure 1:
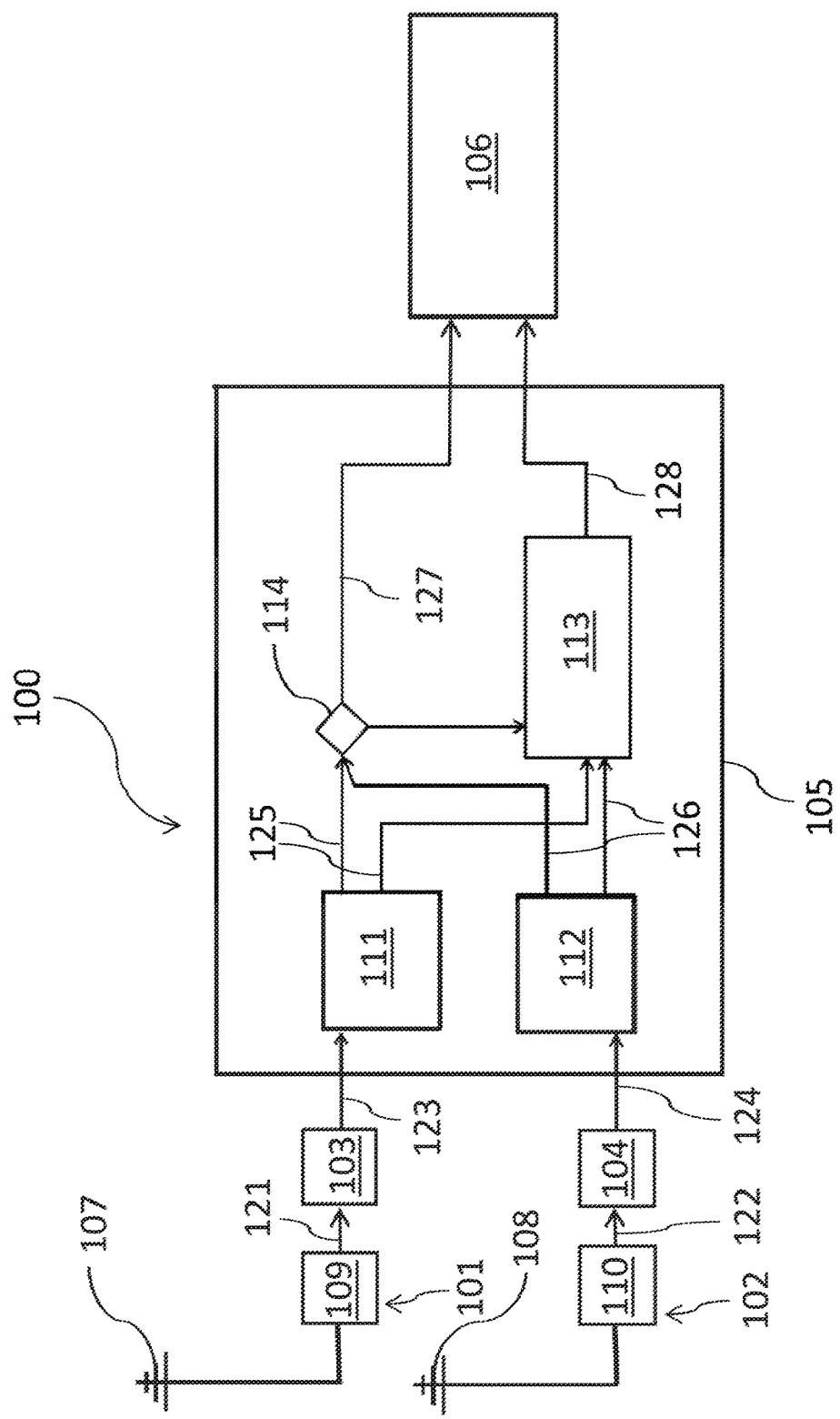

This application claims priority to the German Application No. 10 2016 015 126.9, filed Dec. 17, 2016, now pending, the contents of which are hereby incorporated by reference.

The present disclosure relates to a method and a broadcast receiver device for receiving a broadcast signal.

In addition to an audio broadcast signal, a broadcast signal may contain a data signal, wherein additional data are transmitted. The additional data comprise further information, which, for example, may be output as a radio text. With such additional data, for example a sender identification of a radio station, information on a transmitted audio broadcast content, a news item, such as an actual weather information or a notification such as traffic information is transmitted. A default method for the transmission of such additional data is the so-called RDS (Radio Data System).

The additional data are frequently transmitted as data packets, wherein a data packet comprises a respective portion of said additional data. The respective data packets are transmitted independently from each other, so that transmission of data packets related to first additional data may be interfered, for example may be interrupted, by transmission of data packets related to second additional data. Thus, on the receiver side, data packets related to each other must be identified.

Due to transmission interferences or poor receiving conditions, said additional data may be transmitted defectively or may be received in fragments. Hence, on the receiver side, said additional data received are required to be checked for completeness, especially if important information, such as an actual warning notification, are comprised therein. If said additional data are transmitted as multiple separate data packets, there is the possibility that individual data packets may be transmitted defectively or may be received in fragments, but may also get lost, so that they will not be received at all by the receiver. Thus, on the receiver side, checking is required if all data packets of an information transmitted by means of additional data will be received. Moreover, the data packets need to be put together in the right order.

It is an object of the present disclosure, to provide a method and a broadcast receiver device for receiving a broadcast signal, which are improved in view of identification and correction of errors in said additional data, which are transmitted and received with the broadcast signal.

According to the present disclosure, this object will be solved, in view of the method, by the features of claim 1 and, in view of the broadcast receiver device, by the features of claim 11.

Advantageous embodiments of the present disclosure are the object of the subclaims.

A method according to the present disclosure for receiving a broadcast signal by means of a broadcast receiver device, which comprises a first receiving unit, a second receiving unit, a first data extraction unit, a second data extraction unit, a first decoding unit, a second decoding unit, a combining unit and a further processing unit, comprises the steps of:

receiving the broadcast signal by means of the first receiving unit, so that a first reception signal is provided, receiving the broadcast signal by means of the second receiving unit, so that a second reception signal is provided, extracting a first raw data stream from the first reception signal by means of the first data extraction unit, extracting a second raw data streams from the second reception signal by means of the second data extraction unit, decoding the first raw data stream, so that a first data stream is provided, and checking, if the first data stream is complete, by means of the first decoding unit, decoding des second raw data streams, so that a second data stream is provided, and checking, if the second data stream is complete, by means of the second decoding unit, if the first data stream is complete, further processing first data stream by the further processing unit, if the first data stream is incomplete and the second data stream is complete, further processing the second data stream by the further processing unit, if the first data stream is incomplete and the second data stream is incomplete, combining the first data stream and the second data stream, so that a combined data stream is generated, and checking, if the combined data stream is complete, by means of the combining unit and, if the combined data stream is complete, further processing the combined data stream by the further processing unit.

According to the present disclosure, the broadcast receiver device comprises two of each of a receiving unit, a data extraction unit and a decoding unit. Each one of the two receiving units receives the broadcast signal, thus providing a respective reception signal. From each one of the two reception signals a raw data stream is extracted by means of a data extraction unit. The raw data stream extracted from a reception signal comprises the additional data of the reception signal. Both of the raw data streams are decoded independently from each other by means of one respective decoding unit. In this way, two data streams are generated, each corresponding to said additional data of one of the two reception signals.

Both of the data streams are checked for completeness. If only one of the two data streams is complete, said data stream is processed further. If both data streams complete, one of the two data streams is processed further. If both data streams are incomplete, the two data streams are merged into one combined data stream, which is checked for completeness, and is processed further, if the combined data stream is complete. Herein, a data stream is referred to as being incomplete, if it comprises defective data or if it is lacking data.

By the provision of two data streams, which are independent from each other, from two reception signals of the same broadcast signal, and by the analysis of both data streams the present disclosure allows for improved identification and correction of errors in additional data, which are transmitted with the broadcast signal received. If one of the two data streams shows to be incomplete, the respective other data stream is being processed further, provided that said data stream is complete. Even if both data streams are only incompletely present, a complete combined data stream may be generated by means of combining both data streams and may be processed further, provided that the incorrect or missing data of one of the two data streams may be replaced or may be completed by error-free data of the respective other data stream, respectively. In this way, capacity of forming a complete data stream is significantly improved over provision and analysis of only one data stream.

Moreover, formation of a complete data stream may significantly be increased, especially under poor receiving conditions. If only one data stream would be provided and analyzed, repetition of transmission of said additional data is required to be waited for, in the case that said data stream is incomplete, so that further processing of said additional data would be delayed until a complete data stream would be available. If no repetition of the transmission of said additional data would occur or if incompleteness of said additional data received would not be remedied even by repeated transmission of said additional data, the received additional data could not be processed further. Contrary to this, the present disclosure allows for simultaneous provision and analysis of the two data streams by means of the two decoding units, so that no time delay due to repeated transmission of said additional data occurs, if at least one of the two data streams is complete or if the combined data stream is complete.

One embodiment of the present disclosure provides for the broadcast signal of both receiving units to be received at the same receiving frequency.

Reception of the broadcast signal by both receiving units at the same receiving frequency, on the one hand, simplifies tuning the receiving units onto the same broadcast signal. On the other hand, reception of the broadcast signal by both receiving units at the same receiving frequency is especially advantageous, if reception quality at this receiving frequency is especially good.

In another embodiment of the present disclosure, the first raw data stream and the second raw data stream each comprise check data for identification of transmission errors. The check data of the first raw data stream are analyzed by the first decoding unit, to ascertain completeness of the first data stream, and the check data of the second raw data stream are analyzed by the second decoding unit, to ascertain completeness of the second data stream.

The above-mentioned embodiment advantageously allows for making use of check data, which are comprised by the raw data streams for identification von transmission errors, for checking completeness of the data streams provided by the decoding units. For this, each decoding unit analyzes the check data, which are comprised in the raw data stream decoded by said decoding unit.

In a further embodiment of the present disclosure, the check data of the first raw data stream and the check data of the second raw data stream each comprise a checksum. The checksum of the first raw data stream is analyzed by the first decoding unit by using a cyclic redundancy check and, by the second decoding unit, the checksum of the second raw data stream are analyzed by using a cyclic redundancy check.

The cyclic redundancy check allows for reliable identification of transmission errors in a raw data stream. The above-mentioned embodiment of the present disclosure advantageously provides for the use of a cyclic redundancy check for checking completeness of a data stream provided by one of the decoding units.

Another embodiment of the present disclosure provides for correction of the first data stream by the first decoding unit, by using the check data of the first raw data stream, if it is determined that the first data stream is incomplete. In analogy to this, the second data stream is corrected by the second decoding unit by using the check data of the second raw data stream, if it is determined that the second data stream is incomplete.

The above-mentioned embodiment of the present disclosure provides for the check data of a raw data stream to be also used for the correction of an incomplete data stream generated from the raw data stream. In this way, efficiency of the method of the present disclosure is further improved, since incorrect or missing data may not only be detected but may also be corrected in each one of the data streams by using the appropriate check data. However, a prerequisite for this is that the check data allow for such a correction.

In a further embodiment of the present disclosure, the first raw data stream and the second raw data stream each comprise individual data segments, which each comprise a plurality of related data. Moreover, a signal spacing time is predetermined. A first time span between successive reception of two data segments of the first raw data stream is detected and analyzed by the first decoding unit. A missing data segment is presumed, if the first time span exceeds the signal spacing time. In analogy to this, a second time span between the successive reception of two data segments of the second raw data stream is detected and analyzed by the second decoding unit. A missing data segment is presumed, if the second time span exceeds the signal spacing time.

The above-mentioned embodiment of the present disclosure is of advantage if said additional data are transmitted in data packets, wherein the individual data packets are sent one after another in a known sending interval. The data segments of a raw data streams comprise the additional data of a received data packet. Thus, the reception of data segments of a raw data streams by means of a decoding unit is expected to be as well in time intervals, which approximately match the sending interval. Lacking reception of a data segment by means of a decoding unit within a time span, which exceeds the sending interval may thus be indicative for the loss of the data segment or the associated data packet, respectively. Thus, the signal spacing time is preferably predetermined to be somewhat larger than the sending interval.

In another embodiment of the present disclosure, the first raw data stream and the second raw data stream each comprise individual data segments, wherein successive data segments comprise numbering segment indices. A sequence of segment indices of the first raw data stream is detected and analyzed by the first decoding unit. A missing data segment is presumed, if the detected sequence of segment indices of the first raw data stream is incomplete. In analogy to this, a sequence of segment indices of the second raw data stream is detected and analyzed by the second decoding unit. A missing data segment is presumed, if the detected sequence of segment indices of the second raw data stream is incomplete.

For checking completeness of the data streams provided by the decoding units, the above-mentioned embodiment of the present disclosure makes use of numbering the data segments by means of segment indices. The lack of a data segment in a raw data stream is identified by the lack of the appropriate segment index. Moreover, the segment indices may advantageously be utilized for ordering or classifying the individual data segments of a raw data stream in an order that corresponds to the segment indices.

In a further embodiment of the present disclosure, the broadcast signal comprises a text string, and the first data stream, the second data stream and the combined data stream are each presumed to be complete, if the respective data stream comprises all text characters of the text string.

The above-mentioned embodiment of the present disclosure relates to additional data, which comprise a text string. Such additional data are frequently transmitted together with broadcast signals, for example to transmit a sender identification of an audio broadcast station, information on the transmitted audio broadcast contents or actual news items. It is with an important radio text transmitted with the text string, such as an actual news item, that transmission of all text characters of the text string is of importance, to be able to understandably and unadulteratedly output the radio text. Thus, the above-mentioned embodiment of the present disclosure provides for a data stream comprising a text string to be considered as being complete only if it comprises all text characters of the text string.

In a further embodiment of the present disclosure, the broadcast signal comprises RDS data.

The method according to the present disclosure is particularly advantageously suitable for receiving a broadcast signal comprising RDS data. RDS data are additional data of broadcast signals, which are sent in RDS data groups, which each comprise four data blocks. Each data block comprises 16 data bits for payload and 10 data bits for check data. This advantageously allows for completeness checking of the received data blocks by means of a decoding unit with the check data of the data blocks. Moreover, RDS data groups are transmitted in a predetermined and known temporal sending interval. This offers the advantageous possibility already mentioned above of identifying the loss of data segments in that, within a time span exceeding the sending interval, no data segments are received by means of a decoding unit.

Another advantage of using the method of the present disclosure for receiving a broadcast signal that comprises RDS data results from the fact that RDS for specific data, which comprise important additional information, requires dual reception. In details, those data must be received at least twice and are further processed only if the twice-received data are identical and the completeness checking of those data by means of the check data provides a positive result. This reduces the probability that errors in important data are overseen during completeness checking by means of the check data. The required dual reception of this data may delay further processing thereof. Transmission errors during transmission of the data may delay or may even prevent reception of two identical and complete data sets and may further delay or prevent further processing of the data. Thus, the method according to the present disclosure is especially advantageous for the processing of RDS data, for which dual reception is required, especially since the method allows for faster and more reliable provision of complete data than conventional methods, wherein only one data stream is analyzed for received additional data.

In a further embodiment of the present disclosure, the broadcast signal comprises a DAB broadcast signal.

DAB (Digital Audio Broadcasting) is a transmission routine for digital broadcast signals. Said broadcast signals also comprise additional data. Hence, the method according to the present disclosure is advantageously also useful for the reception of DAB broadcast signals.

A broadcast receiver device according to the present disclosure comprises:
- a first receiving unit, which is designed for receiving a broadcast signal, so that a first reception signal is provided,
- a second receiving unit, which is designed for receiving the broadcast signal, so that a second reception signal is provided,
- a first data extraction unit, which is designed for extracting a first raw data streams from the first reception signal,
- a second data extraction unit, which is designed for extracting a second raw data streams from the second reception signal,
- a first decoding unit, which is designed for decoding the first raw data stream, so that a first data stream is provided, and checking, if the first data stream is complete,
- a second decoding unit, which is designed for decoding the second raw data stream, so that a second data stream is provided, and checking, if the second data stream is complete,
- a combining unit, which is designed for combining the first data stream and the second data stream, if the first data stream is incomplete and the second data stream is incomplete, so that a combined data stream is generated, and checking, if the combined data stream is complete, and
- a further processing unit, which is designed for further processing the first data streams, if the first data stream is complete, further processing the second data stream, if the first data stream is incomplete and the second data stream is complete, and further processing the combined data stream, if the combined data stream is complete.

The advantages of the broadcast receiver device according to the present disclosure correspond to the above-mentioned advantages of the method of the present disclosure.

Figure 2:
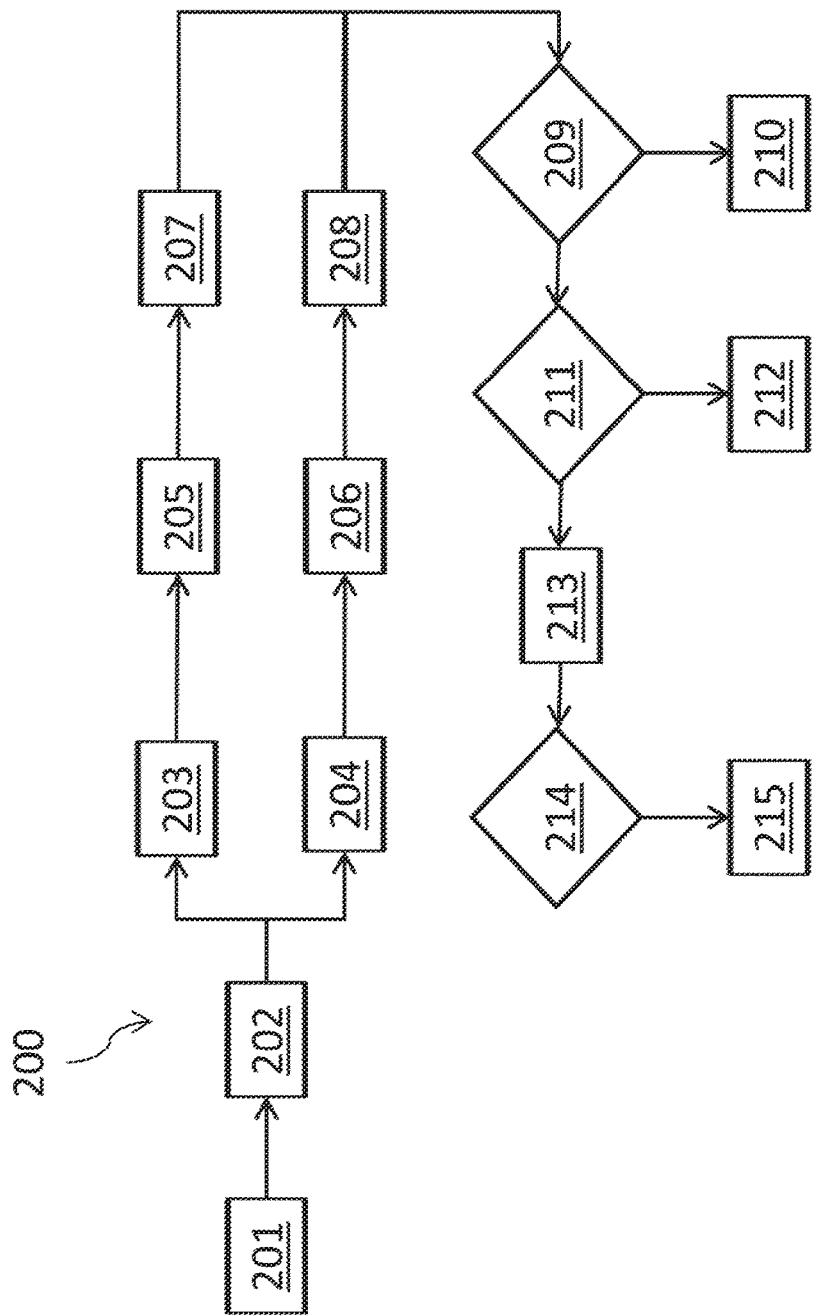
Figure 3:
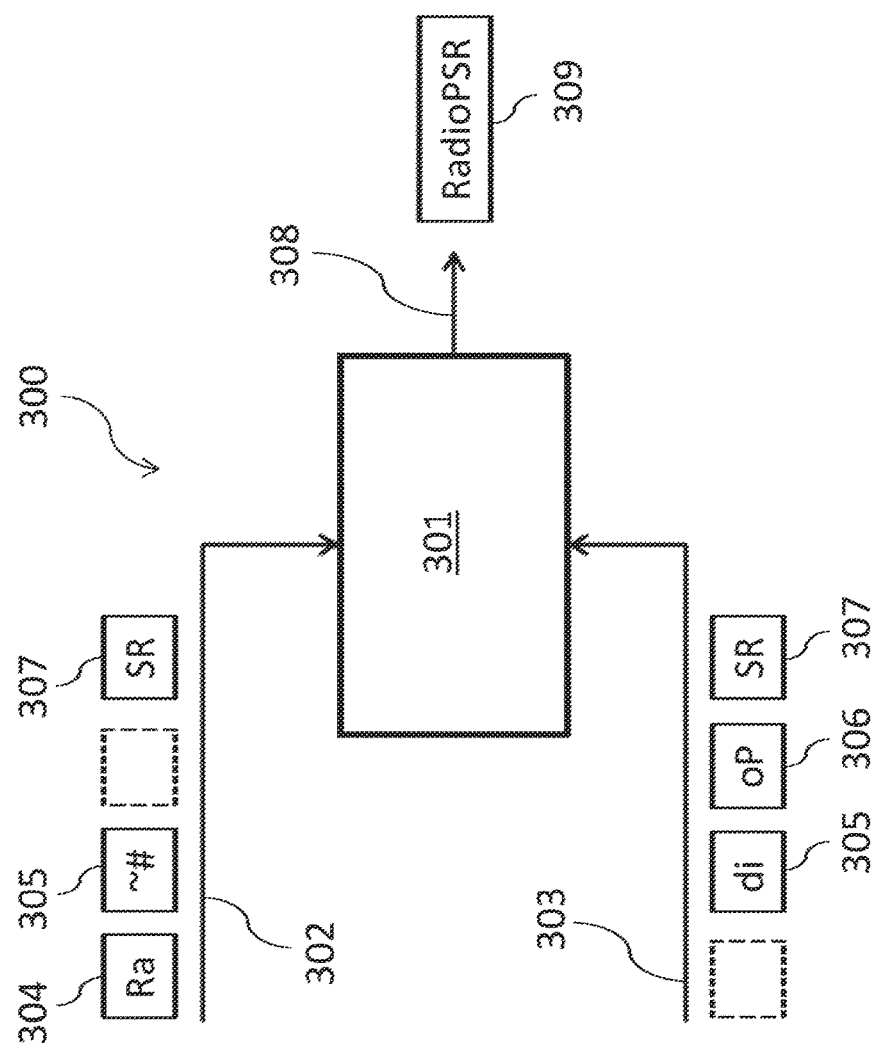

In the following, embodiments of the present disclosure will be explained in detail by means of drawings, wherein:

FIG. 1 schematically shows a broadcast receiver device according to an embodiment of the present disclosure, FIG. 2 shows a flow chart of a method for receiving a broadcast signal according to an embodiment of the present disclosure, and FIG. 3 shows an input/output diagram of a decoder according to an embodiment of the present disclosure.

FIG. 1 schematically shows a broadcast receiver device 100 for receiving a broadcast signal. The broadcast receiver device 100 may be a component of a radio apparatus that, for example, is associated to a vehicle.

The broadcast signal comprises an audio broadcast signal of an audio broadcast program and a data signal having additional data. The additional data are transmitted in multiple data packets, each one comprising a data segment having a plurality of related additional data. A data segment comprises payload and check data. The data signal is, for example, a RDS signal.

The payload of a data segments each comprise a portion of a text string, which text string represents a program name of the audio broadcast program. Additionally or alternatively, the payload could each comprise a portion of a text string of a radio text with information on the audio broadcast program or a news item.

The check data are for checking completeness of the payload. Incompleteness of the received payload may arise due to a transmission error upon transmission of the data signal. For example, transmission may be hampered on the transmission path from one transmitting station sending the broadcast signal to the broadcast receiver device 100, so that individual data segments are transmitted defectively or will even get completely lost. For identification of a transmission error, the check data for example comprise checksums. Additionally or alternatively, the data segments comprise segment indices, numbering consecutive data segments, so that the segment indices defining an order of the data segments and allowing identification of the loss of a data segments by means of a missing segment index.

The broadcast receiver device 100 comprises a first receiving unit 101, a second receiving unit 102, a first data extraction unit 103, a second data extraction unit 104, a decoder 105 and a further processing unit 106.

The first receiving unit 101 is configured for receiving the broadcast signal, so that a first reception signal 121 is provided. The first receiving unit 101 comprises a first antenna 107 and a first tuner unit (tuner) 109. The first tuner unit 109 creates the first reception signal 121 by filtering and optionally increases a frequency portion associated to the broadcast signal from the signal received by the first antenna 107.

The second receiving unit 102 is configured for receiving the broadcast signal, so that a second reception signal 122 is provided. The second receiving unit 102 comprises a second antenna 108 and a second tuner unit (Tuner) 110. The second tuner unit 110 creates the second reception signal 122 by filtering and optionally increasing a frequency portion associated to the broadcast signal from the signal received by the second antenna 108.

The first data extraction unit 103 is configured for extracting a first raw data stream 123 from the first reception signal 121. The first raw data stream 123 comprises said additional data of the first reception signals 121.

The second data extraction unit 104 is configured for extracting a second raw data stream 124 from the second reception signal 122. The second raw data stream 124 comprises said additional data of the second reception signal 122.

The decoder 105 comprises a first decoding unit 111, a second decoding unit 112, a combining unit 113 and a selection unit 114. The decoder 105 is, for example, designed as a software module.

The first decoding unit 111 is configured for decoding the first raw data stream 123, so that a first data stream 125 is provided, and checking, if the first data stream 125 is complete.

The second decoding unit 112 is configured for decoding the second raw data stream 124, so that a second data stream 126 is provided, and checking, if the second data stream 126 is complete.

The selection unit 114 is configured for forwarding a selected data stream 127 to the further processing unit 106, if the first data stream 125 is complete or the second data stream 126 is complete, and for activating the combining unit 113, if the first data stream 125 is incomplete and the second data stream 126 is incomplete. The selected data stream 127 corresponding to the first data stream 125, if the first data stream 125 is complete, and the selected data stream 127 corresponding to the second data stream 126, if the first data stream 125 is incomplete and the second data stream 126 is complete.

The combining unit 113 is configured for combining the first data stream 125 with the second data stream 126, if the first data stream 125 is incomplete, and the second data stream 126 is incomplete, so that a combined data stream 128 is generated, and checking, if the combined data stream 128 is complete.

The further processing unit 106 is configured for further processing the first data stream 125, if the first data stream 125 is complete, further processing the second data stream 126, if the first data stream 125 is incomplete, and the second data stream 126 is complete, and further processing the combined data stream 128, if the first data stream 125 is incomplete, the second data stream 126 is incomplete and the combined data stream 128 is complete.

In the following, besides FIG. 1, reference is made to FIG. 2. FIG. 2 shows a flow chart 200 of a method for receiving the broadcast signal by means of a broadcast receiver device 100 described in FIG. 1.

In a first process step 201, the method is initialized, for example, following activation of the broadcast receiver device 100.

In a second process step 202, for example, a radio station is manually selected by a user of the broadcast receiver device 100 or is selected automatically by means of a preselection of the broadcast receiver device 100. In this way, the first tuner unit 109 and the second tuner unit 110 are each set to a receiving frequency of the radio station.

In a third process step 203, the broadcast signal is received by means of the first receiving unit 101 and the first reception signal 121 is provided. For this, a frequency portion associated to the broadcast signal is filtered from the signal received by the first antenna 107 by means of the first tuner unit 109 and is optionally amplified.

In a fourth process step 204, the broadcast signal is received by means of the second receiving unit 102 and the second reception signal 122 is provided. For this, a frequency portion associated to the broadcast signal is filtered by means of the second tuner unit 110 from the signal received by the second antenna 108 and is optionally amplified. The third process step 203 and the fourth process step 204 are performed simultaneously.

In a fifth process step 205, the first raw data stream 123 is extracted by means of the first data extraction unit 103 from the first reception signal 121. The first raw data stream 123 comprises the portions of the first reception signals 121 corresponding to the data signal of the broadcast signal.

In a sixth process step 206, the second raw data stream 124 is extracted by means of the second data extraction unit 104 from the second reception signal 122. The second raw data stream 124 comprises the portions of the second reception signal 122 corresponding to the data signal of the broadcast signal. The fifth process step 205 and the sixth process step 206 are performed simultaneously.

In a seventh process step 207, the first raw data stream 123 is decoded by means of the first decoding unit 111, so that the first data stream 125 is provided. Moreover, the first data stream 125 is checked for completeness by means of the first decoding unit 111.

In an eighth process step 208, the second raw data stream 124 is decoded by means of the second decoding unit 112, so that the second data stream 126 is provided. Moreover, the second data stream 126 is checked for completeness by means of the second decoding unit 112. The seventh process step 207 and the eighth process step 208 are performed simultaneously.

In decoding a raw data streams 123, 124 by means of a decoding unit 111, 112, the payload of the raw data streams 123, 124 contained in the data segments are assembled to the respective data stream 125, 126. Optionally, defective payload are corrected, if possible.

For checking a data stream 125, 126 for completeness and for optional correction of defective payload, the check data of the data segments of the respective raw data stream 123, 124 are analyzed by the decoding unit 111, 112.

If the check data of a data segment have a checksum for a cyclic redundancy check, the checksum is analyzed by the decoding unit 111, 112 by using the cyclic redundancy check, to check the payload of the data segment for completeness. Optionally, upon analysis of the checksum, defective payload of the data segment will also be corrected, as far as they have been detected.

If the data segments comprise segment indices, which consecutively number successive data segments, the segment indices are analyzed by the decoding unit 111, 112, to generate the respective data stream 125, 126 and to check for completeness. The segment indices are used to combine or to assemble the payload of the individual data segments into an appropriate order corresponding to the segment indices, respectively. Moreover, lack of a data segment may be detected by means of lack of the respective segment index.

If the data segments are transmitted in data packets, which are sent in a known temporal sending interval from each other, for example a signal spacing time corresponding to that sending interval are predetermined. Moreover, a first time span between the successive reception of two data segments of the first raw data stream 123 is detected by the first decoding unit 111 A missing data segment in the first raw data stream 123 will be closed, if the first time span exceeds the signal spacing time. In analogy to this, a second time span between the successive reception of two data segments of the second raw data stream 124 is acquired by the second decoding unit. A missing data segment in the second raw data stream is presumed, if the second time span exceeds the signal spacing time.

Thus, at the end of the eighth process step 208, the first data stream 125 and the second data stream 126 is provided.

In a ninth process step 209, it is checked, if the first data stream 125 is complete. If it is determined, that the first data stream 125 is complete, the first data stream 125 is forwarded to the further processing unit 106 by means of the selection unit 114 and the method is continued by a tenth process step 210. Otherwise, i.e. if the first data stream 125 is incomplete, the method is continued by an eleventh process step 211.

In the tenth process step 210, the first data stream 125 is processed by the further processing unit 106. For example, from the first data stream 125 a text is created and output by the further processing unit 106, if the payload of the first data streams 125 comprises a text string.

In an eleventh process step 211, it is checked, if the second data stream 126 is complete. If it is determined, that the second data stream 126 is complete, the second data stream 126 is forwarded to the further processing unit 106 by means of the selection unit 114 and the method is continued with a twelfth process step 212. Otherwise, i.e. if the second data stream 126 is incomplete, the method is continued with a thirteenth process step 213.

In the twelfth process step 212, the second data stream 126 is processed by the further processing unit 106. For example, from the second data stream 126, a text is created and output by the further processing unit 106, if the payload of the second data stream 126 comprise a text string.

In the thirteenth process step 213, the first data stream 125 is combined with the second data stream 126 to the combined data stream 128 by means of the combining unit 113.

In a fourteenth process step 214, the combined data stream 128 is checked for completeness by means of the combining unit 113. If the combined data stream 128 is complete, the combined data stream 128 is output by the combining unit 113 to the further processing unit 106, and the method is continued with a fifteenth process step 215. Otherwise, the combined data stream 128 is discarded.

In the fifteenth process step 215, the combined data stream 128 is processed by the further processing unit 106. For example, from the combined data stream 128, a text is created and output by the further processing unit 106, if the payload of the combined data stream 128 comprise a text string.

FIG. 3 shows an input/output diagram 300 having a decoder 301, which is set up similar to decoder 105 in FIG. 1. In this example, a program name "RadioPSR" of a radio station is transmitted with the data signal of a broadcast signal. The data signal is transmitted in four data segments 304 to 307, each payload of which comprising two characters of the program name.

A first raw data stream 302 and a second raw data stream 303 is fed to the decoder 301. The first raw data stream 302 comprises three data segments 304, 305, 307. Two data segments 304, 307 of the first raw data stream 302 are without defects, one data segment 305 of the first raw data stream 302 comprises defective payload. The second raw data stream 303 comprises three data segments 305 to 307, which each are without defects. In the first raw data stream 302, the data segment 306 is missing, in the second raw data stream 303, the data segment 304 is missing.

Since each data segment 304 to 307 is present without defects in at least one raw data stream 302, 303, a combined data stream 308 which is without defects, may be created by means of the decoder 301 by the method described above by FIG. 2, from the two raw data streams 302, 303, the combined data stream comprising a text string 309 with the program name and being output by the decoder 301.

The invention claimed is:

1. A method for receiving a broadcast signal by means of a broadcast receiver device, comprising the steps of:
receiving the broadcast signal, so that a first reception signal is provided;
receiving the broadcast signal, so that a second reception signal is provided;
extracting a first raw data stream from the first reception signal;
extracting a second raw data streams from the second reception signal;
decoding the first raw data stream, so that a first data stream is provided, and checking, if the first data stream is complete;
decoding of the second raw data stream, so that a second data stream is provided, and checking if the second data stream is complete;
further processing the first data streams when the first data stream is complete;
further processing the second data stream when the first data stream is incomplete and the second data stream is complete;
combining the first data streams with the second data stream when the first data stream is incomplete and the second data stream is incomplete, so that a combined data stream is generated, and checking if the combined data stream is complete, and if the combined data stream is complete, further processing the combined data stream.

2. The method according to claim 1, wherein the broadcast signal is received at the same receiving frequency.

3. The method according to claim 1, wherein the first raw data stream and the second raw data stream each comprise check data for identification of transmission errors, the check data of the first raw data stream are analyzed, to check for completeness of the first data streams, and the check data of the second raw data stream are analyzed, to check for completeness of the second data streams.

4. The method according to claim 3, wherein the check data of the first raw data stream and the check data of the second raw data stream each comprise a checksum, the checksum of the first raw data stream is analyzed by using a cyclic redundancy check, and the checksum of the second raw data stream is analyzed by using a cyclic redundancy check.

5. The method according to claim 3, wherein the first data stream is corrected by means of the check data of the first raw data stream, when the first data stream is incomplete, and the second data stream is corrected by means of the check data of the second raw data stream, when the second data stream is incomplete.

6. The method according to claim 1, wherein the first raw data stream and the second raw data stream each comprise individual data segments, a signal spacing time is predetermined, a first time span between the successive reception of two data segments of the first raw data stream is acquired and a missing data segment is presumed, if the first time span exceeds the signal spacing time, and a second time span between the successive reception of two data segments of the second raw data stream is acquired and a missing data segment is presumed, if the second time span exceeds the signal spacing time.

7. The method according claim 1, wherein the first raw data stream and the second raw data stream each comprise individual data segments and segment indices numbering successive data segments, a sequence of segment indices of the first raw data stream is detected, and a missing data segment is presumed, when the detected sequence of segment indices of the first raw data stream is incomplete, and a sequence of segment indices of the second raw data stream is detected and a missing data segment is presumed, when the detected sequence of segment indices of the second raw data stream is incomplete.

8. The method according to claim 1, wherein the broadcast signal comprises a text string and the first data stream, the second data stream and the combined data stream each are considered as being complete, when the data stream comprises all text characters of the text string.

9. The method according to claim 1, wherein the broadcast signal comprises at least one of: RDS data and a DAB broadcast signal.

* * * * *